United States Patent
Chen et al.

(10) Patent No.: US 8,026,767 B2
(45) Date of Patent: Sep. 27, 2011

(54) ADAPTIVE BIAS CIRCUIT AND SYSTEM THEREOF

(75) Inventors: Chih-Wei Chen, Taipei (TW);
Chuan-Jane Chao, Taipei (TW);
Shyh-Chyi Wong, Taipei (TW)

(73) Assignee: RichWave Technology Corp., Neihu District, Taipei (TW)

( * ) Notice: Subject to any disclaimer, the term of this patent is extended or adjusted under 35 U.S.C. 154(b) by 0 days.

(21) Appl. No.: 12/545,084

(22) Filed: Aug. 21, 2009

(65) Prior Publication Data

US 2011/0043287 A1    Feb. 24, 2011

(51) Int. Cl.
*H03F 3/04* (2006.01)
(52) U.S. Cl. .......... 330/296; 330/285
(58) Field of Classification Search .......... 330/285, 330/288, 289, 296
See application file for complete search history.

(56) References Cited

U.S. PATENT DOCUMENTS 6,441,687 B1 *   8/2002   Apel .................... 330/296

* cited by examiner

*Primary Examiner* — Robert Pascal
*Assistant Examiner* — Khiem D Nguyen
(74) *Attorney, Agent, or Firm* — Winston Hsu; Scott Margo

(57) ABSTRACT

An adaptive bias circuit which provides a more sensitive adaptive bias current with respect to power level is used for biasing an electronic circuit. The adaptive bias circuit has a first transistor coupled to a power supply, a voltage bias circuit coupled to the first transistor and the power supply biasing the first transistor, and a first power coupling module coupled to the first transistor and the electronic circuit for coupling a portion of input signal power to the first transistor. A second transistor is coupled to the first transistor and the power supply to increase the current gain of the adaptive bias circuit, and a second current coupling module is coupled to the second transistor and the electronic circuit to provide adaptive bias current to the electronic circuit.

25 Claims, 11 Drawing Sheets

ADAPTIVE BIAS CIRCUIT AND SYSTEM THEREOF

BACKGROUND OF THE INVENTION

1. Field of the Invention

The present invention relates to an adaptive bias circuit, and more particularly, to an adaptive bias circuit for adaptively biasing a system.

2. Description of the Prior Art

At present, electronic devices are ubiquitous. They can be found in nearly every place imaginable, including the home, the workplace, vehicles, and even our pockets. And, as electronic device technologies mature, for the same cost, the electronic devices become more portable, use less power, and offer greater functionality. In part, this is due to availability of smaller geometry electronic components, such as transistors and on-chip capacitors. However, novel circuit architectures with improved specifications are also responsible for overall performance gains in the electronic devices.

Amplifiers are a key component in practically every electronic device. They vary broadly in their electrical characteristics, such as gain, bandwidth, and linearity, and vary even more in their application to active filters, buffers, analog-to-digital converters, and RF transceivers.

Currently, most amplifiers used in integrated circuits use a transistor, or transistors, for providing signal amplification. In some applications, such as power amplifiers for RF transceivers, linear operation of the amplifying transistor(s) is an important design consideration. To achieve linear operation of the amplifying transistor(s), a bias circuit is coupled to the amplifier to provide a bias current or voltage to the amplifying transistor(s). Typically, the bias current or voltage is selected to maximize a linear operating region while minimizing the current consumption of the amplifying transistor(s).

One technique used to increase the linear operating region of the amplifying transistor(s) is adaptive biasing. Instead of biasing the amplifying transistor(s) with a fixed bias current or voltage, an adaptive bias circuit is utilized to provide more or less DC current or voltage based on characteristics of the input signal, such as amplitude, phase, frequency, etc. The adaptive bias circuit may also be used in conjunction with a traditional bias circuit, in effect providing fine-tuning of the bias current or voltage provided.

Please refer to FIG. 1, which is a diagram of an adaptive bias circuit according to the prior art. In the prior art, the adaptive bias circuit biases a power amplifier transistor Q1 that outputs an output signal through an output matching circuit. The adaptive bias circuit has a bias transistor Q2, a first bias resistor R1, a first bias diode D1, and a second bias diode D2. A collector of the bias transistor Q2 is coupled to a power supply voltage Vcc. An emitter of the bias transistor Q2 is coupled to a base of the power amplifier transistor Q1. A first bias resistor R1 is coupled between a bias reference voltage Vbias and a base of the bias transistor Q2. An anode of the first bias diode D1 is coupled to the base of the bias transistor Q2 and a cathode of the first bias diode D1 is coupled to an anode of the second bias diode D2. A cathode of the second bias diode D2 is coupled to ground.

As power of an input signal received through a capacitor C1 increases, i.e. power at the emitter of the bias transistor Q2 increases, the bias transistor Q2 emits more adaptive bias current to the base of the power amplifier transistor Q1 to maintain operation in a linear region. The required adaptive bias current to keep a power amplifier transistor operating linearly depends on the characteristics of the power amplifier transistor itself and the matching circuit coupled to the power amplifier.

In some cases, as the input power increases, the adaptive bias current provided by the emitter of the bias transistor Q2 may not be large enough to keep the amplifier operating in the linear region. In such a case, an improved adaptive bias circuit is needed to provide an adaptive bias current that is more sensitive to the input power level.

Please refer to FIG. 4, which is a diagram of a bias circuit according to the prior art. The bias circuit shown in FIG. 4 is disclosed in U.S. Pat. No. 6,859,103 (hereafter '103), entitled "Bias Circuit for Improving Linearity of a Radio Frequency Power Amplifier," and comprises a bias transistor 412 biased by two diodes 401, 402 and a resistor 403. The bias transistor 412 provides bias current to a power amplifier transistor 422. RF input is applied to a base of the power amplifier transistor 422, and is partially isolated from an emitter of the bias transistor 412 by an inductor 404. An LC series-connected resonator circuit 405, 406 conducts a second harmonic of the RF input to ground. This architecture emits more adaptive bias current with increased input power through the bias transistor 412, but is not able to provide an agile adaptive current response with changes in the input power.

Please refer to FIG. 5, which is a diagram of a bias circuit according to the prior art. The bias circuit shown in FIG. 5 is disclosed in U.S. Pat. No. 6,744,321, entitled "Bias Control Circuit for Power Amplifier," and comprises a primary bias circuit 502 for biasing a power amplifier transistor 501. The bias circuit further comprises a supplementary bias circuit 504, which is turned on or off through a control voltage Vcom, and provides supplemental bias current to the power amplifier transistor 501. The bias circuit shown in FIG. 5 only allows for two possible power modes: a lower output power mode, and a high output power mode, and more transistors must be added if more power modes are required. Further, the power mode is decided by the control voltage Vcom, which implies that extra circuitry is required to provide the voltage Vcom, and to determine when to switch the voltage Vcom.

SUMMARY OF THE INVENTION

An adaptive bias circuit for adaptively biasing a power amplifier comprises a first transistor coupled to a power supply, a voltage bias circuit coupled to the first transistor, a first coupling module coupled to the first transistor, a second transistor coupled to the first transistor and the power supply, and a second coupling module coupled to the second transistor. The first transistor has a first terminal, a second terminal coupled to the power supply, and a third terminal. The voltage bias circuit is coupled to the first terminal of the first transistor and the power supply for providing a bias voltage to the first transistor. The first coupling module has a first terminal coupled to the third terminal of the first transistor, and a second terminal coupled to an input of the power amplifier for coupling a portion of input signal power to the third terminal of the first transistor. The second transistor has a first terminal coupled to the third terminal of the first transistor, a second terminal coupled to the power supply, and a third terminal. And, finally, the second coupling module has a first terminal coupled to the third terminal of the second transistor, and a second terminal coupled to the input of the power amplifier to provide the adaptive bias current.

According to a second embodiment of the present invention, an adaptive bias circuit for adaptively biasing a power amplifier comprises a bias diode, a bias circuit, a first coupling module, a second transistor, and a second coupling module. The bias diode has a first terminal and a second terminal. The bias circuit is coupled to the first terminal of the bias diode and the power supply for providing a bias to the bias diode. The first coupling module has a first terminal coupled to the second terminal of the bias diode, and a second terminal coupled to an input of the power amplifier for coupling a portion of input signal power to the second terminal of the bias diode. The second transistor has a first terminal coupled to the second terminal of the bias diode, a second terminal coupled to the power supply, and a third terminal. The second coupling module has a first terminal coupled to the third terminal of the second transistor, and a second terminal coupled to the input of the power amplifier.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
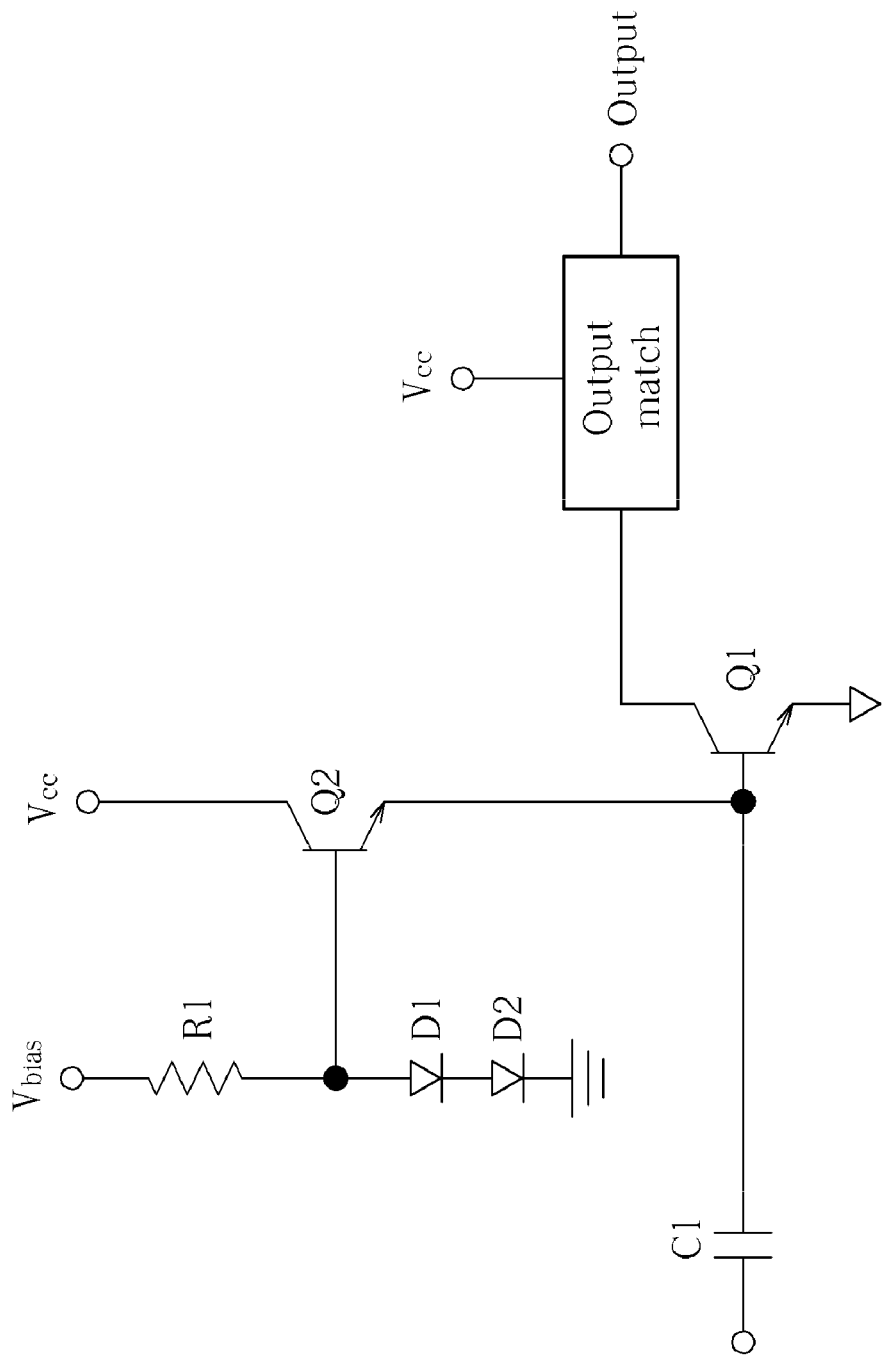
FIG. 1 is a diagram of an adaptive bias circuit according to the prior art.
Figure 2:
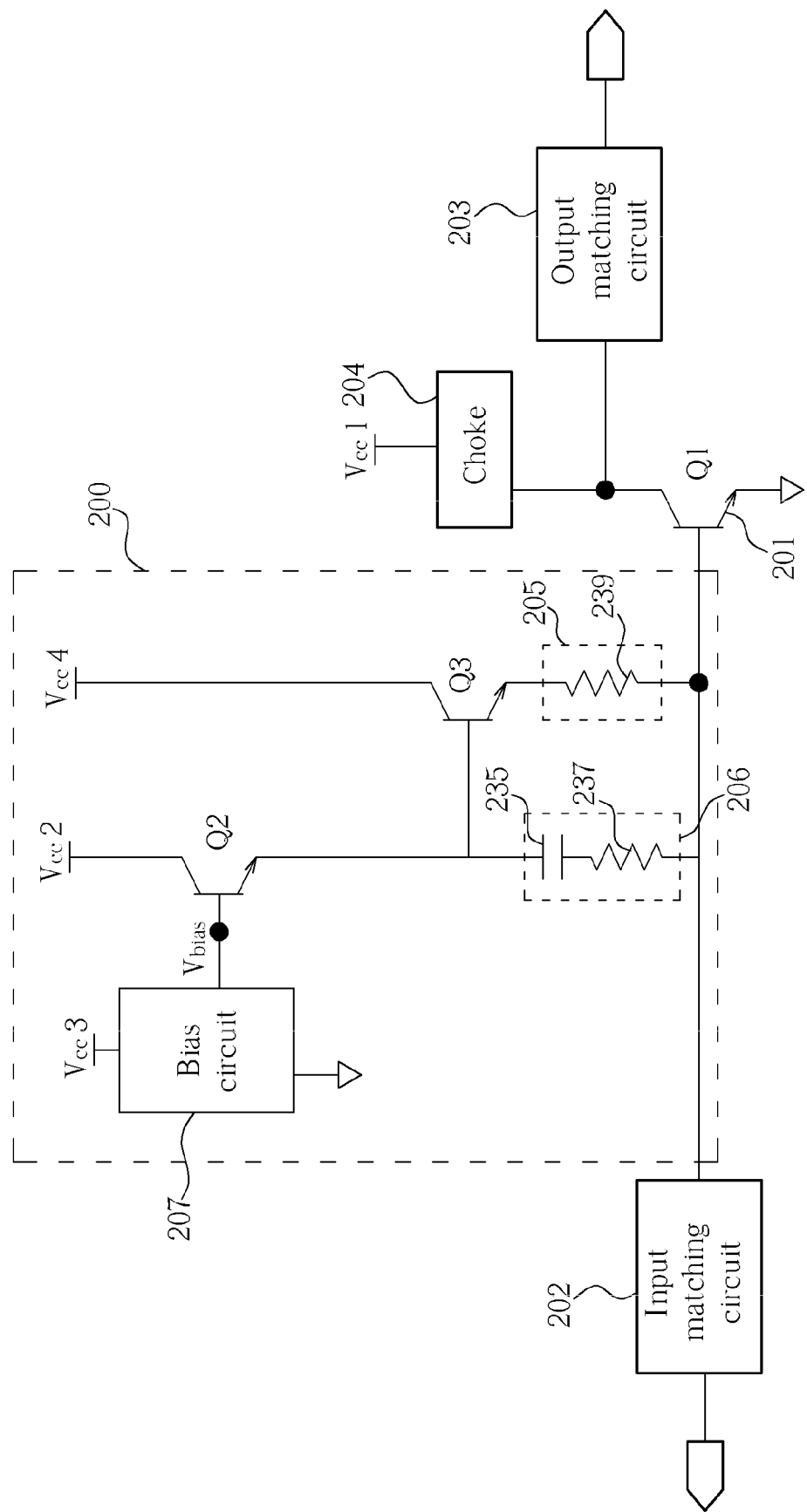
FIG. 2 is a diagram of an adaptive bias circuit according to the present invention.

Please refer to FIG. 2, which is a diagram of an adaptive bias circuit 200 according to the present invention. The adaptive bias circuit 200 biases a power amplifier transistor Q1, which is coupled to a first power supply Vcc1 through a choke 204 and outputs an output signal through an output matching circuit 203. The power amplifier transistor Q1 receives an input signal through an input matching circuit 202 at a base (first terminal, input) of the power amplifier transistor Q1. An emitter (third terminal) of the power amplifier transistor Q1 is coupled to a reference voltage.

The adaptive bias circuit 200 comprises a bias transistor (first transistor) Q2, a current gain transistor (second transistor) Q3, a bias circuit 207, a first coupling module 206, and a second coupling module 205. A collector (second terminal) of the bias transistor Q2 is coupled to a second power supply Vcc2. An emitter (third terminal) of the bias transistor Q2 is coupled to a base (first terminal) of the current gain transistor Q3. A collector (second terminal) of the current gain transistor Q3 is coupled to a fourth power supply Vcc4.

The bias circuit 207 biases a base (first terminal) of the bias transistor Q2. The bias circuit 207 is coupled to a third power supply Vcc3 and a reference voltage, and may be a current mirror or a voltage divider, both of which are commonly known in the art, and have many variations. For example, the bias circuit 207 may be realized as three diode-connected transistors in series coupled in series with a resistor establishing a bias voltage Vbias. Or, the bias circuit 207 may be realized as two diode-connected transistors in series, or as two diode-connected transistors and a resistor in series.

Figure 6:
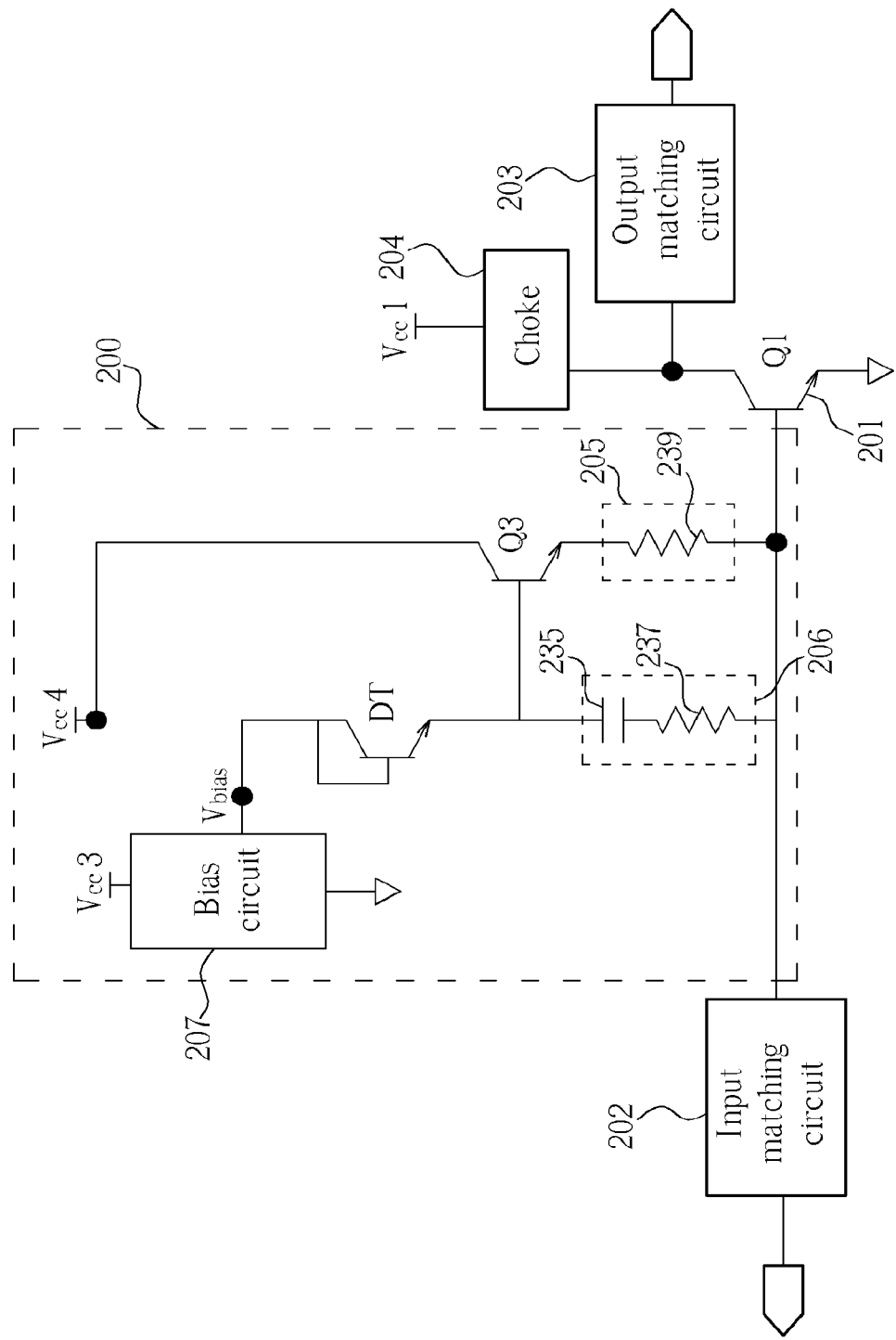
FIG. 6 to FIG. 11 are diagrams of adaptive bias circuits according to other embodiments of the present invention.
Figure 7:
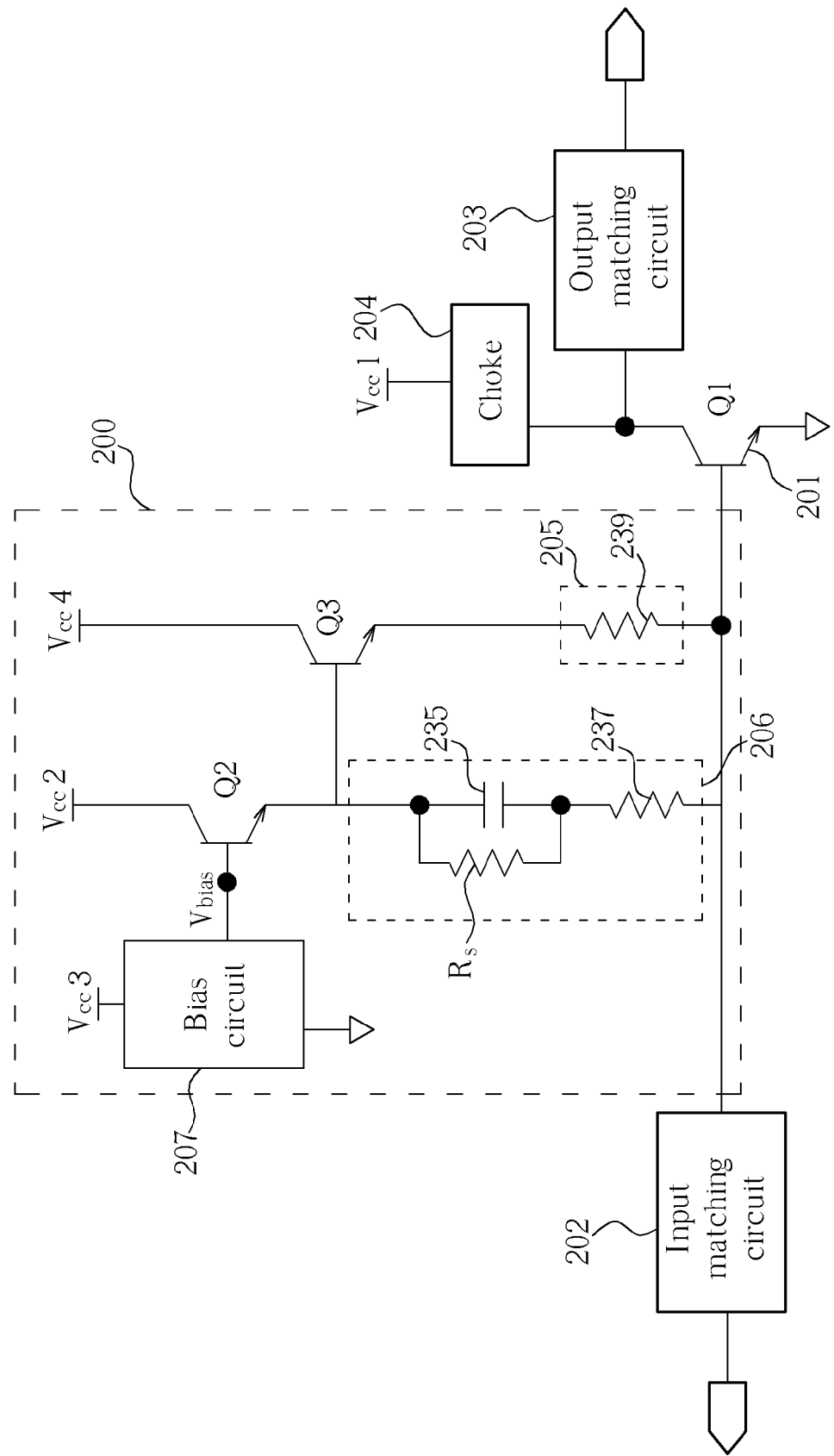

The first coupling module 206 has a first terminal coupled to an emitter (third terminal) of the bias transistor Q2, and a second terminal coupled to the base of the power amplifier transistor Q1. As shown, the first coupling module 206 may have a capacitor 235 and a series resistor 237 in series coupled to the emitter of the bias transistor Q2. Order of the capacitor 235 and the series resistor 237 may be as shown in FIG. 2, or may be inverted. In other words, the capacitor 235 has a first terminal and a second terminal, and the series resistor 237 has a first terminal coupled to the second terminal of the capacitor 235 and a second terminal. The series resistor 237 is optional, and may also be realized with a short. In either case, with or without the series resistor 237, the first coupling module 206 may also comprise a shunt resistor $R_s$ coupled from the first terminal of the capacitor 235 to the second terminal of the series resistor 237, or coupled from the first terminal of the capacitor 235 to the second terminal of the capacitor 235 as shown in FIG. 7. Further, a diode circuit, e.g. a diode or diode-connected transistor, could also be coupled between the emitter of the bias transistor Q2 and the base of the power amplifier transistor Q1 as the first coupling module 206. An example of a diode-connected transistor in an embodiment of the invention is shown in FIG. 6, which is functionally similar to FIG. 3 except the diode D1 in FIG. 3 has been replaced by the diode-connected transistor DT.

Figure 8:
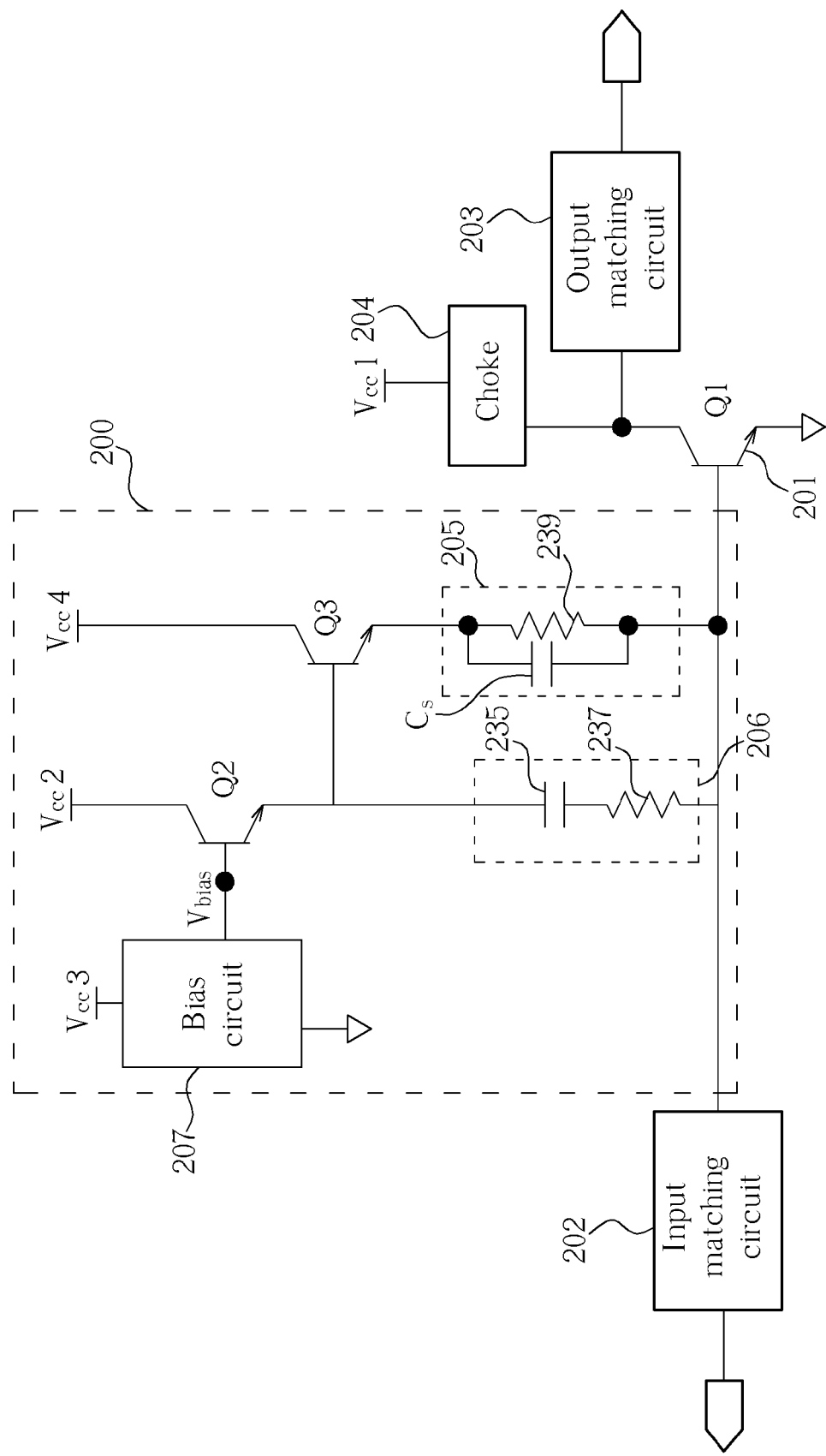
Figure 9:
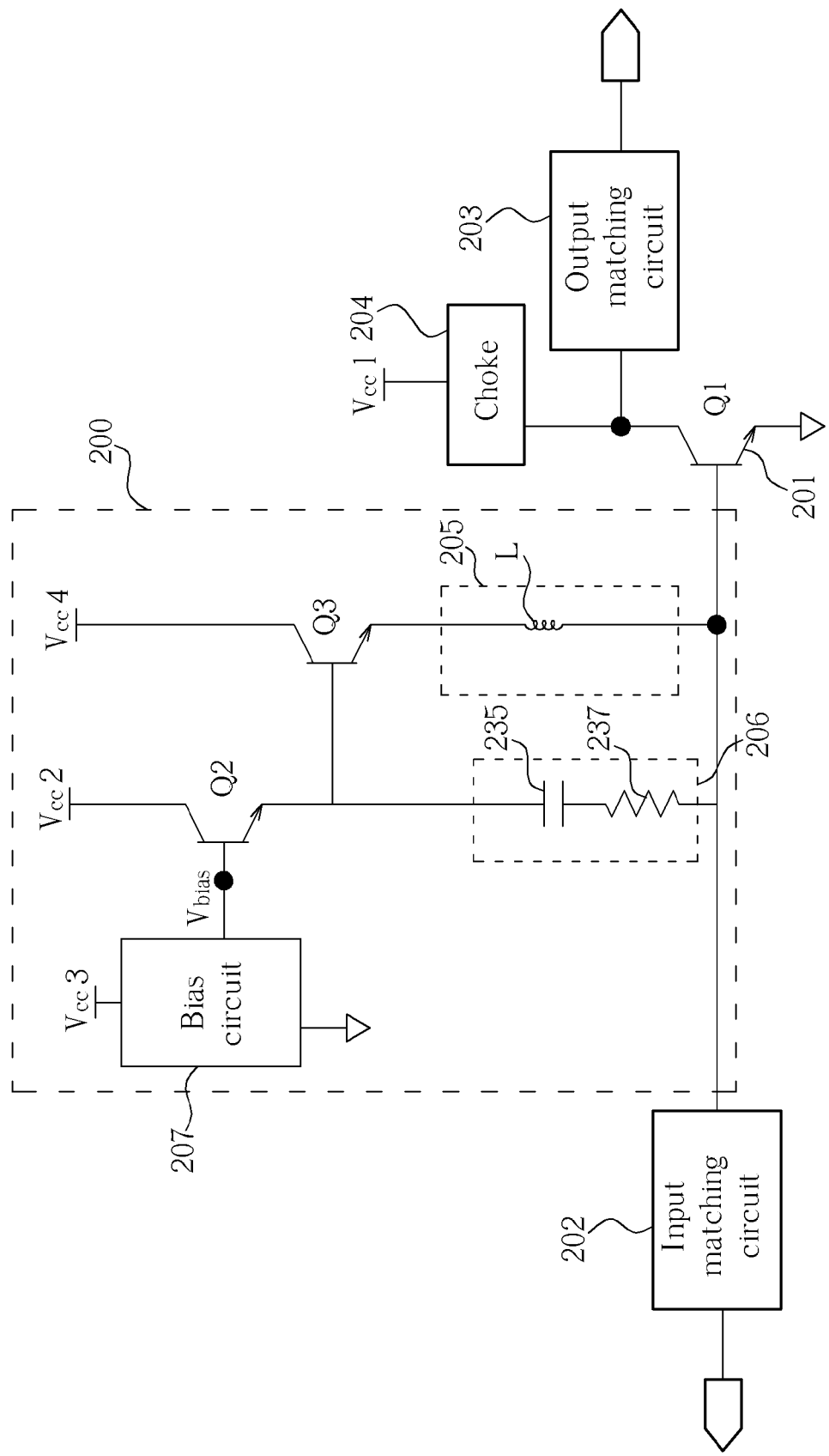
Figure 10:
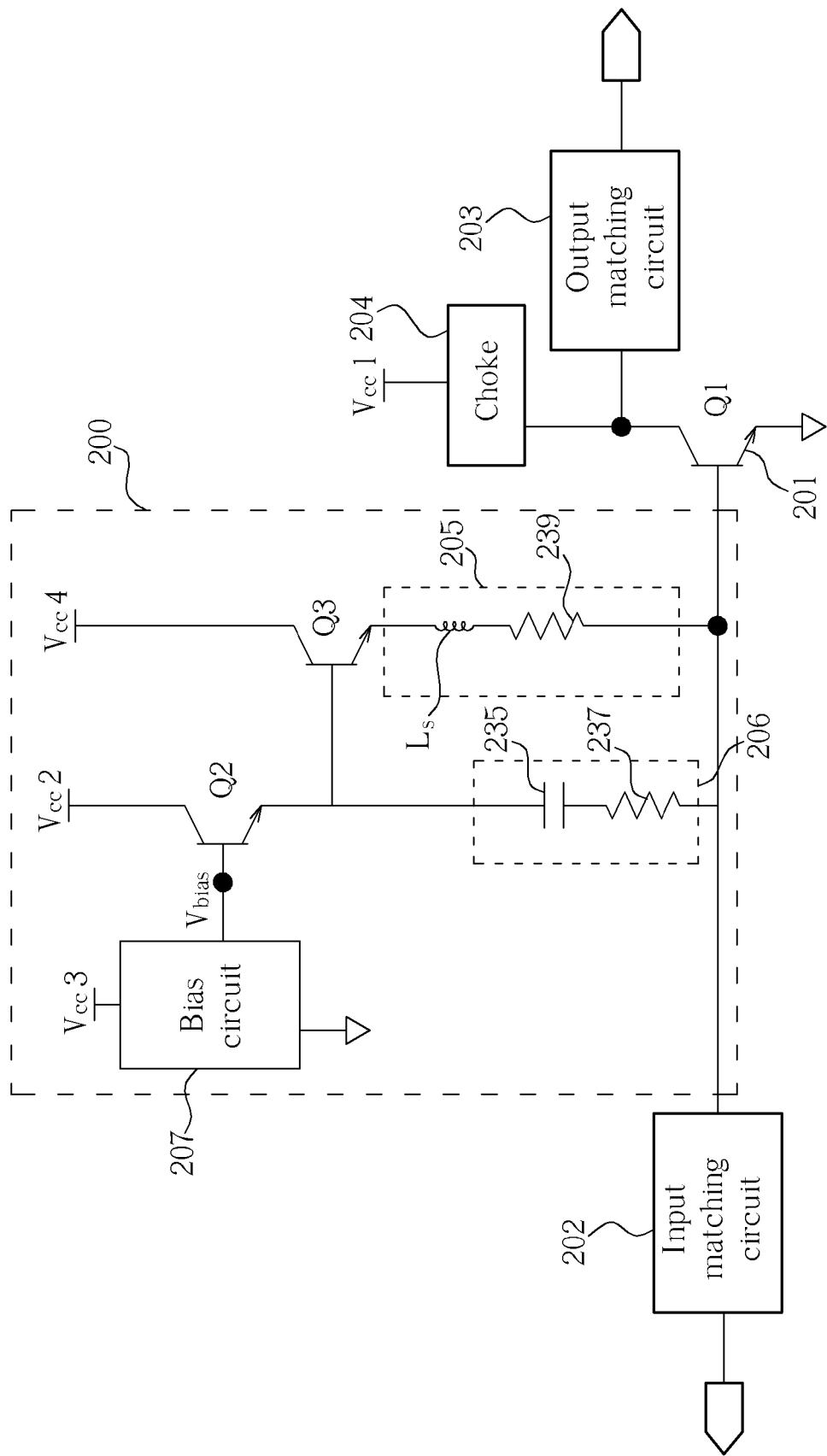
Figure 11:
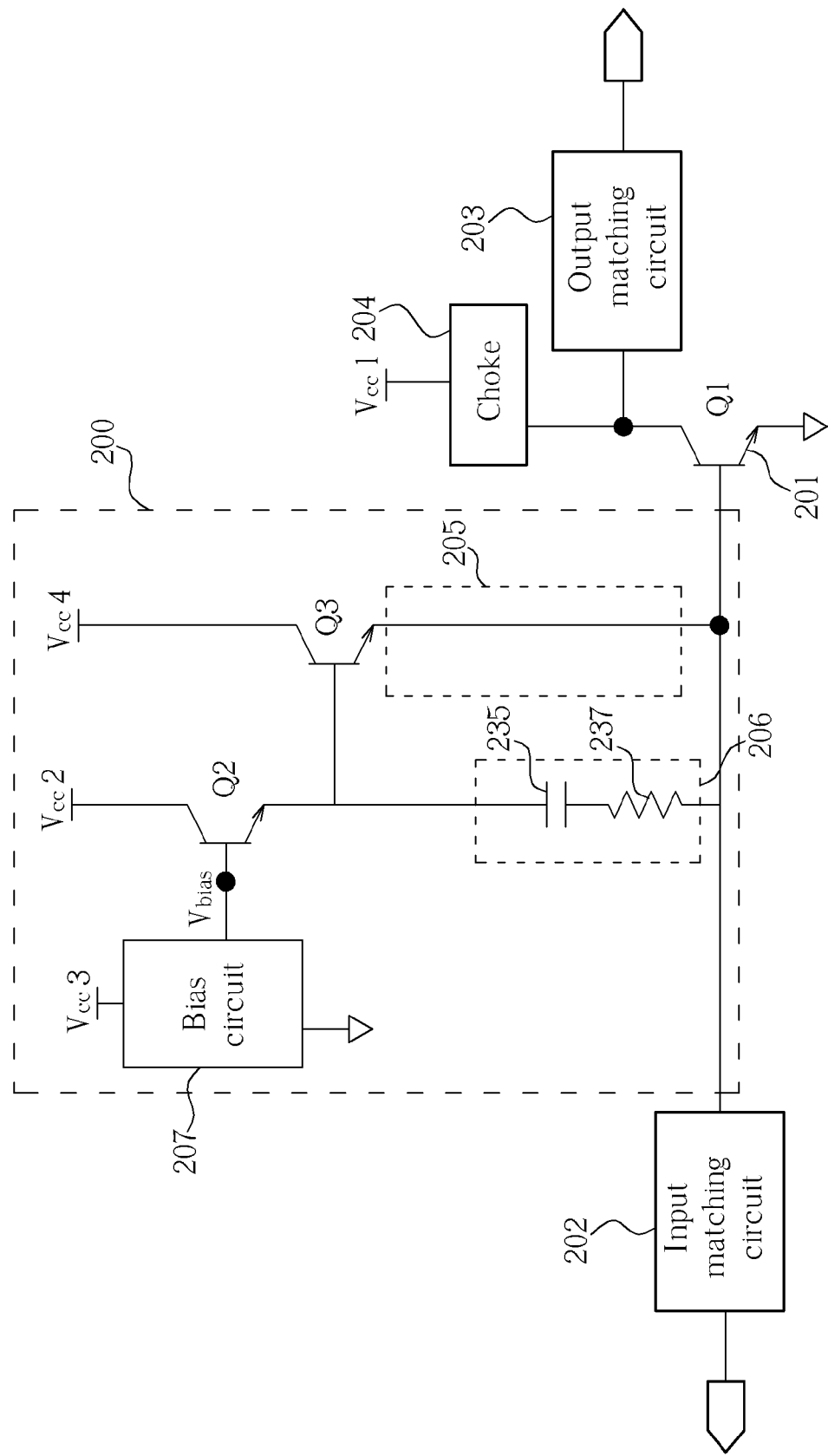

The second coupling module 205 has a first terminal coupled to an emitter (third terminal) of the current gain transistor Q3 and a second terminal coupled to the base of the power amplifier transistor Q1. The second coupling module 205 may comprise a resistor 239 having a first terminal coupled to the emitter of the current gain transistor Q3, and a second terminal coupled to the base of the power amplifier transistor Q1. The second coupling module 205 may further comprise a shunt capacitor $C_s$ coupled in parallel with the resistor 239 as shown in FIG. 8, the shunt capacitor $C_s$ having a first terminal coupled to the emitter of the current gain transistor Q3, and a second terminal coupled to the base of the power amplifier transistor Q1. The second coupling module 205 may also be realized as an inductor L as shown in FIG. 9, as an inductor $L_s$ coupled in series with a series resistor 239 as shown in FIG. 10, or as a short as shown in FIG. 11.

Figure 3:
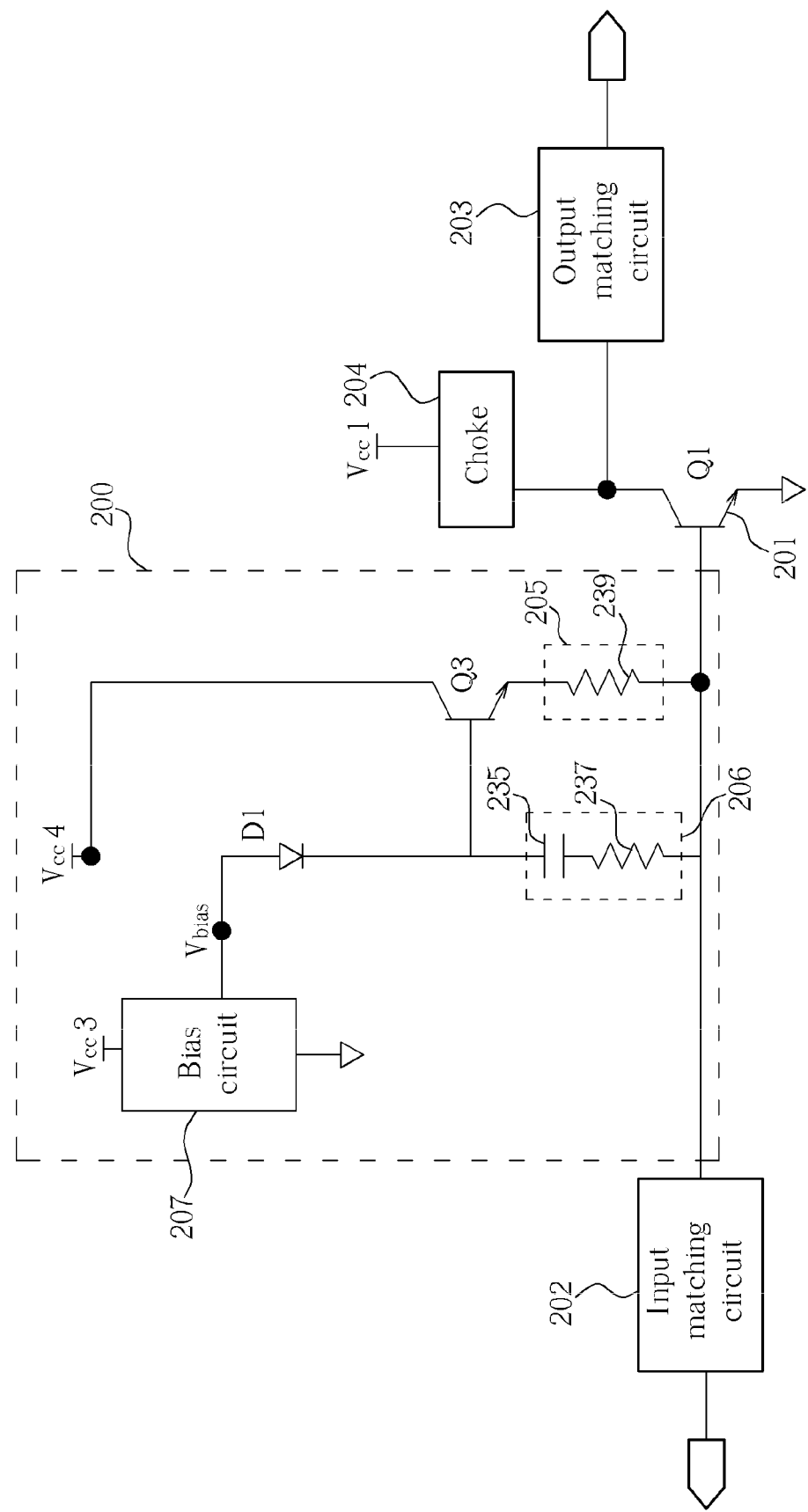
FIG. 3 is a diagram of an adaptive bias circuit according to a second embodiment of the present invention.
Figure 4:
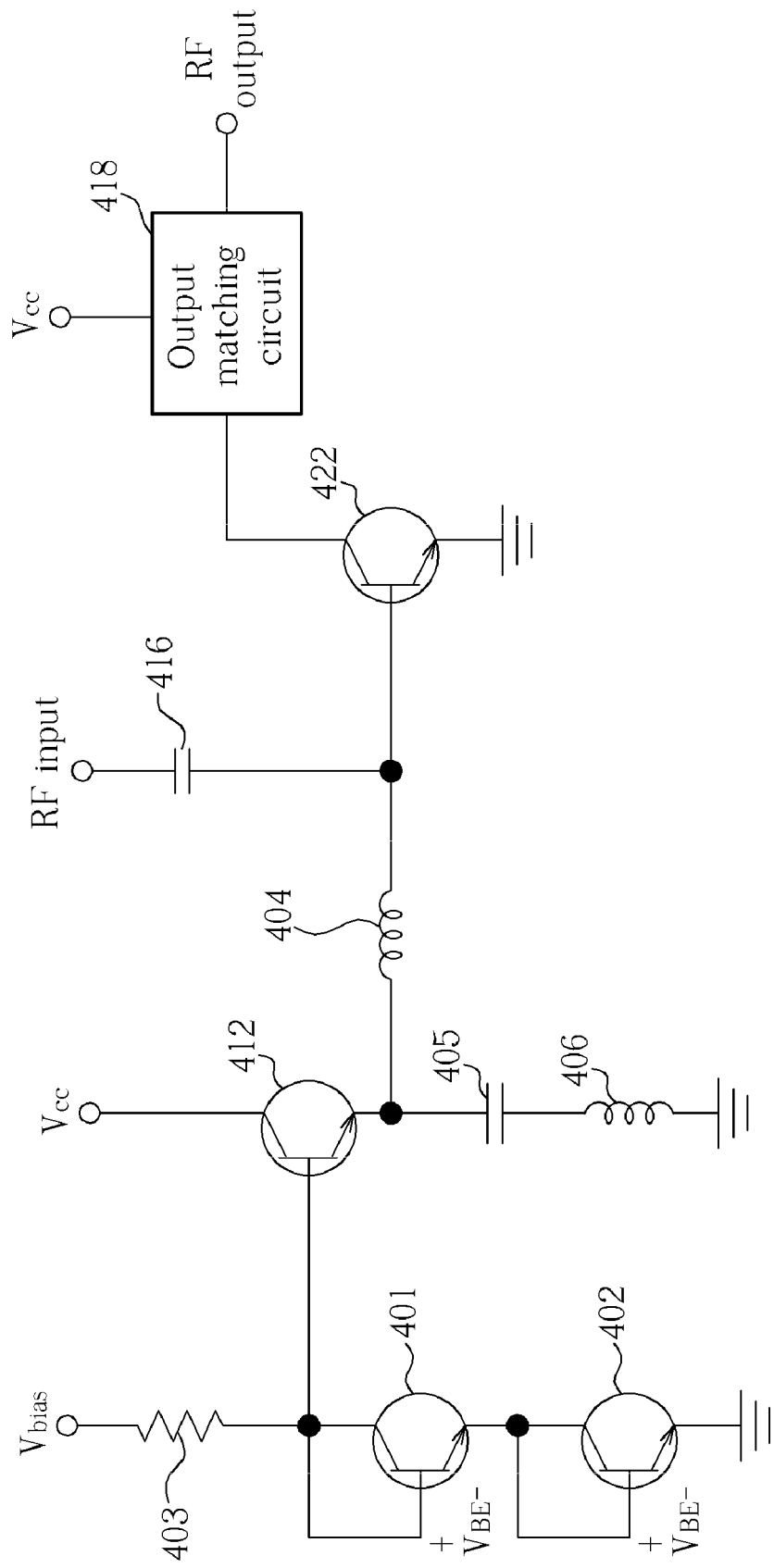
FIG. 4 is a diagram of a bias circuit according to the prior art.
Figure 5:
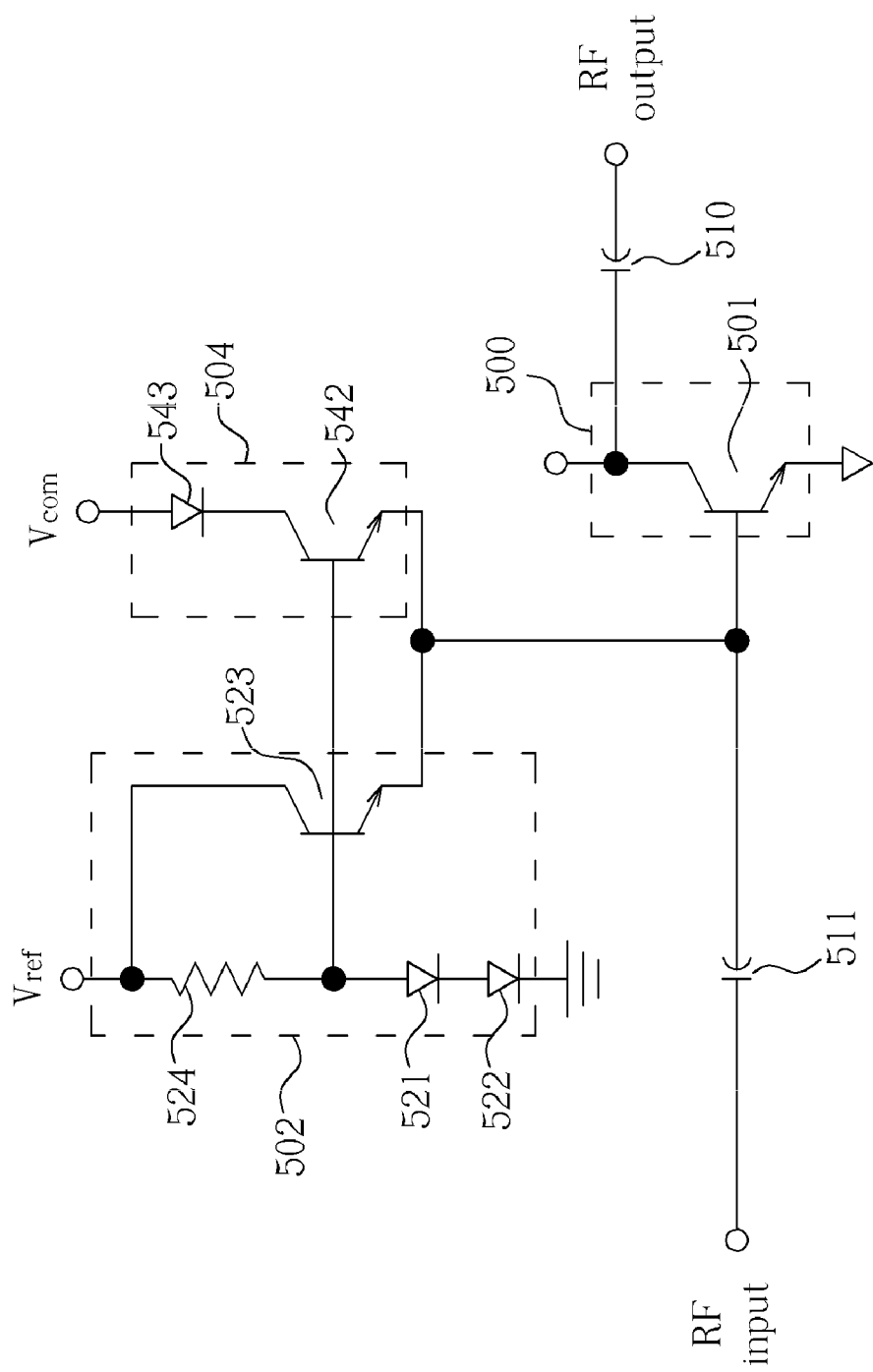
FIG. 5 is a diagram of a bias control circuit according to the prior art.

Please refer to FIG. 3, which is a diagram illustrating a second embodiment of the adaptive bias circuit 200. The second embodiment is similar to the first embodiment, so description is only given for differences between the second embodiment and the first embodiment. Compared to the embodiment shown in FIG. 2, in the second embodiment, the bias transistor Q2 may be replaced with a bias diode D1 coupled from Vbias to the base of the current gain transistor Q3. The bias diode D1 may be a diode-connected transistor.

In operation, for the first embodiment, when signal power of the input signal increases, the bias transistor Q2 may receive more power through the first coupling module 206, and more adaptive current may be generated and fed to the base of the current gain transistor Q3. This current may then amplified by the current gain of the current gain transistor Q3, and fed to the power amplifier transistor Q1 through the second coupling module 205. Likewise, in operation for the second embodiment, when signal power of the input signal increases, the bias diode D1 may receive more power through the first coupling module 206, and more adaptive current may be generated and fed to the base of the current gain transistor Q3. This current may then amplified by the current gain of the current gain transistor Q3, and fed to the power amplifier transistor Q1 through the second coupling module 205.

The embodiments described above may also be applied to a low noise amplifier (LNA) or a mixer. The power amplifier transistor Q1, the bias transistor Q2, and the current gain transistor Q3 may be realized in metal-oxide-semiconductor (MOSFET), metal-semiconductor field effect transistor (MESFET), bipolar junction transistor (BJT), or heterojunction bipolar transistor (HBT) technology. Capacitors may be realized in metal-insulator-metal (MIM), metal-oxide-metal (MOM), MOS-cap (MOSFET-capacitor), inter-digit-capacitor, or junction-capacitor technology. Diodes may be realized as diode-connected transistors. Please also note that the first power supply Vcc1, the second power supply Vcc2, the third power supply Vcc3, and the fourth power supply Vcc4 may all be designed independently, but may also be combined into one or more power supplies as needed.

Compared with the prior art, the adaptive bias circuit 200, embodied as shown in FIGS. 2 and 3, generates a bias current that increases faster as the input power increases, because the adaptive current of the bias transistor Q2 or the bias diode D1 is amplified by the current gain of Q3. Therefore, the bias point of the power amplifier transistor Q1 can move from class AB to class A faster as the input power increases.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An adaptive bias circuit for an electronic circuit including an input signal terminal, comprising:
    a first transistor having a first terminal, a second terminal coupled to a first power supply, and a third terminal;
    a bias circuit coupled to the first terminal of the first transistor and a second power supply for providing a bias to the first transistor;
    a first coupling module having a first terminal coupled to the third terminal of the first transistor, and a second terminal coupled to an input of the electronic circuit for coupling input signal power to the third terminal of the first transistor;
    a second transistor having a first terminal coupled to the third terminal of the first transistor, a second terminal coupled to a third power supply, and a third terminal; and
    a second coupling module having a first terminal coupled to the third terminal of the second transistor, and a second terminal coupled to the input of the electronic circuit.

2. The adaptive bias circuit of claim 1, wherein the first coupling module comprises:
    a capacitor having a first terminal coupled to the third terminal of the first transistor, and a second terminal coupled to the input of the electronic circuit.

3. The adaptive bias circuit of claim 2, wherein the first coupling module further comprises a shunt resistor coupled from the first terminal of the capacitor to the second terminal of the capacitor.

4. The adaptive bias circuit of claim 1, wherein the first coupling module comprises:
    a capacitor having a first terminal coupled to the third terminal of the first transistor, and a second terminal; and
    a series resistor having a first terminal coupled to the second terminal of the capacitor, and a second terminal coupled to the input of the electronic circuit.

5. The adaptive bias circuit of claim 4, wherein the first coupling module further comprises a shunt resistor coupled from the first terminal of the capacitor to the second terminal of the resistor.

6. The adaptive bias circuit of claim 1, wherein the first coupling module comprises a diode having a cathode terminal coupled to the third terminal of the first transistor, and an anode terminal coupled to the input of the electronic circuit.

7. The adaptive bias circuit of claim 1, wherein the second coupling module comprises a resistor having a first terminal coupled to the third terminal of the second transistor, and a second terminal coupled to the input of the electronic circuit.

8. The adaptive bias circuit of claim 7, wherein the second coupling module further comprises a capacitor having a first terminal coupled to the third terminal of the second transistor, and a second terminal coupled to the input of the electronic circuit.

9. The adaptive bias circuit of claim 1, wherein the second coupling module comprises an inductor having a first terminal coupled to the third terminal of the second transistor, and a second terminal coupled to the input of the electronic circuit.

10. The adaptive bias circuit of claim 1, wherein the second coupling module comprises:
    an inductor having a first terminal coupled to the third terminal of the second transistor and a second terminal; and
    a series resistor having a first terminal and a second terminal, the first terminal of the series resistor coupled to the second terminal of the inductor and the second terminal of the series resistor coupled to the input of the electronic circuit.

11. The adaptive bias circuit of claim 1, wherein the second coupling module comprises a short coupled between the third terminal of the second transistor and the input of the electronic circuit.

12. The adaptive bias circuit of claim 1, wherein the first transistor and the second transistor are MOSFET, MESFET, HBT, or BJT transistors.

13. An adaptive bias circuit for an electronic circuit including an input signal terminal, comprising:
    a bias diode having a first terminal and a second terminal;
    a bias circuit coupled to the first terminal of the bias diode and a first power supply for providing a bias to the bias diode;
    a first coupling module having a first terminal coupled to the second terminal of the bias diode, and a second terminal coupled to an input of the electronic circuit for coupling input signal power to the second terminal of the bias diode;
    a second transistor having a first terminal coupled to the second terminal of the bias diode, a second terminal coupled to a second power supply, and a third terminal; and
    a second coupling module having a first terminal coupled to the third terminal of the second transistor, and a second terminal coupled to the input of the electronic circuit.

14. The adaptive bias circuit of claim 13, wherein the first coupling module comprises:
    a capacitor having a first terminal coupled to the second terminal of the bias diode, and a second terminal coupled to the input of the electronic circuit.

15. The adaptive bias circuit of claim 14, wherein the first coupling module further comprises a shunt resistor coupled from the first terminal of the capacitor to the second terminal of the capacitor.

16. The adaptive bias circuit system of claim 13, wherein the first coupling module comprises:
    a capacitor having a first terminal coupled to the second terminal of the bias diode and a second terminal; and
    a resistor having a first terminal coupled to the second terminal of the capacitor, and a second terminal coupled to the input of the electronic circuit.

17. The adaptive bias circuit of claim 16, wherein the first coupling module further comprises a shunt resistor coupled from the first terminal of the capacitor to the second terminal of the capacitor.

18. The adaptive bias circuit of claim 13, wherein the first coupling module comprises a diode having a cathode terminal coupled to the second terminal of the bias diode, and an anode terminal coupled to the input of the electronic circuit.

19. The adaptive bias circuit of claim 13, wherein the second coupling module comprises a resistor having a first terminal coupled to the third terminal of the second transistor, and a second terminal coupled to the input of the electronic circuit.

20. The adaptive bias circuit of claim 19, wherein the second coupling module further comprises a capacitor having a first terminal coupled to the third terminal of the second transistor, and a second terminal coupled to the input of the electronic circuit.

21. The adaptive bias circuit of claim 13, wherein the second coupling module comprises an inductor having a first terminal coupled to the third terminal of the second transistor, and a second terminal coupled to the input of the electronic circuit.

22. The adaptive bias circuit of claim 13, wherein the second coupling module comprises a short coupled between the third terminal of the second transistor and the input of the electronic circuit.

23. The adaptive bias circuit of claim 13, wherein the bias diode is a diode-connected transistor.

24. The adaptive bias circuit of claim 13, wherein the first transistor and the second transistor are MOSFET, MESFET, HBT, or BJT transistors.

25. The adaptive bias circuit of claim 13, wherein the second coupling module comprises:
   an inductor having a first terminal and a second terminal, the first terminal coupled to the third terminal of the second transistor; and
   a series resistor having a first terminal and a second terminal, the first terminal of the series resistor coupled to the second terminal of the inductor and the second terminal of the series resistor coupled to the input of the electronic circuit.

* * * * *